United States Patent [19]
Shinmori

[11] Patent Number: 5,656,838
[45] Date of Patent: Aug. 12, 1997

[54] NON-VOLATILE SEMICONDUCTOR MEMORY HAVING PROGRAMMING REGION FOR INJECTING AND EJECTING CARRIERS INTO AND FROM FLOATING GATE

[75] Inventor: Masahiro Shinmori, Tokyo, Japan

[73] Assignee: NEC Corporation, Tokyo, Japan

[21] Appl. No.: 422,931

[22] Filed: Apr. 17, 1995

[30] Foreign Application Priority Data

Apr. 19, 1994 [JP] Japan .................................. 6-104421

[51] Int. Cl.⁶ ............................................. H01L 29/788
[52] U.S. Cl. ........................ 257/315; 257/318; 257/321
[58] Field of Search ................................... 257/315, 316, 257/318, 320, 321

[56] References Cited

U.S. PATENT DOCUMENTS 4,019,197  4/1977  Lohstroh et al. ...................... 257/319
4,924,278  5/1990  Logie .................................... 257/318

FOREIGN PATENT DOCUMENTS 0 120 303  10/1984  European Pat. Off. .
0133667    3/1985   European Pat. Off. ............... 257/318
2 562 707  10/1985  France .
59-155968  9/1984   Japan .

OTHER PUBLICATIONS

A. Thomsen et al., "A Floating-Gate MOSFET with Tunneling Injector Fabricated Using a Standard Double-Polysilicon CMOS Process", IEEE Electron Device Letters, Mar. 1991, vol. 12, No. 3, pp.111–113.

Primary Examiner—Mark V. Prenty
Attorney, Agent, or Firm—Young & Thompson

[57] ABSTRACT

An electrically erasable and programmable read only memory device includes a plurality of memory cells, each of which has a drain region, a source region, and a programming region, a first gate insulating film covering a part of the drain region, a second gate insulating film covering a part of the programming region, and a floating gate having a first portion overlapping the first gate insulating film to form a first capacitance therebetween and a second portion overlapping the second gate insulating film to form a second capacitance. The first capacitance is designed to be larger than the second capacitance, so that the injection and extraction of carriers take place between the programming region and the floating gate.

3 Claims, 9 Drawing Sheets

NON-VOLATILE SEMICONDUCTOR MEMORY HAVING PROGRAMMING REGION FOR INJECTING AND EJECTING CARRIERS INTO AND FROM FLOATING GATE

BACKGROUND OF THE INVENTION

1. Field of the Invention

The present invention relates to a non-volatile semiconductor memory device and, more particularly, to an electrically erasable and programmable read only memory device (EEPROM) including a plurality of memory cell transistors each having a control gate and a floating gate.

2. Description of the Related Art

As well known in the art, each cell transistor employed in such an EEPROM is constructed such that a floating gate is formed over a channel region of a semiconductor substrate defined by source and drain regions with an intervening gate insulating film, and a control gate is formed on another gate insulating film covering the floating gate. By applying a certain voltage between the control gate and the drain region, carriers such as electrons are injected and extracted into and from the floating gate. The EEPROM of this type, however, requires a relatively complicated manufacturing process because of the formation of the control gate over the floating gate.

Therefore, such an EEPROM is disclosed in Japanese Patent Application Disclosure SHO No. 59-155968 that simplifies the manufacturing process. This EEPROM constitutes a control gate with a diffusion region.

Referring to FIGS. 10(A) and 10(B), each memory cell in such an EEPROM includes $N^+$-type impurity diffusion layers 23, 24, 25 and 26 selectively formed in a device formation region or an active region on a P-type single-crystal silicon substrate 21 which is partitioned or defined by a field oxide layer 22. This memory cell is composed of a cell transistor and a select transistor. The diffusion layer 23 serves as a source region of the cell transistor, and the diffusion layer 24 serves as a drain region of the cell transistor and further as a source region of the select transistor. The diffusion layer 25 operates as a drain region of the select transistor. This region 25 also serves as a bit line. The diffusion layer 26 serves as a control gate of the cell transistor. This region 26 is covered with a gate insulating film 28 made of silicon oxide, on which a floating gate 29 made of polysilicon is formed. The floating gate 29 is elongated over a gate insulating film 27 covering the channel region between the source region 23 and the drain region 24.

The channel region between the regions 24 and 25 for the select transistor is covered with a gate insulating film 30, over which a selector gate 31 for the select transistor crosses. Each of the floating gate 29 and the selector gate 31 may be formed simultaneously as a first level wiring layer of a multi-level wiring structure.

A silicon oxide layer 32 is formed over the entire surface by the so-called CVD method. Formed on the silicon oxide layer 32 in a horizontal direction in parallel to each other are an aluminum common line 34 connected to the source region 23 through a contact hole 33 and a bit line 36 made of aluminum connected to the bit line region 25 through a contact hole 35.

Although only one memory cell is shown in FIG. 10, the control gate region 26 is elongated to be employed in common for the adjacent cells, as shown in FIG. 11. Further, in order to reduce the resistance of the region 26, a wiring layer 37 is formed along the region 26 and connected thereto via contact holes 38. It is to be noted that, the wiring 37 is buried in the insulating layer 32 and made of polysilicon. The wiring layer 37 is further formed to cover the floating gates 29 via the silicon oxide layer 32.

Referring to FIG. 12, the memory cell thus constructed has a cell transistor Qm and a select transistor Qs. As is also apparent from the above description, the transistors Qm and Qs are connected to the word line $WL_i$ (31), the wiring line (CGi) 37, the common line ($CL_j$) 34 and the bit line ($BL_j$) 36.

An erasing operation for the above cell is performed by setting the drain region 24 to 0 volts and the control gate region 26 to a higher potential, to thereby inject electrons into the floating gate 29 by the Fowler-Nordheim (F-N) tunnel effect from the drain region 24. Conversely, a programming operation for the cell is performed by setting the control gate region 26 to 0 volts and the drain region 24 to a higher potential. The electrons are thus extracted from the floating gate 29 through the silicon oxide layer 27 by an F-N tunnel effect to the drain region. Thus, the injection and extractions of carriers are performed in this EEPROM, like the conventional EEPROM.

Here, representing the voltage between the drain region 24 and programming region 26 as $V_{CG}$, the capacitance (of the section of the silicon oxide layer 27) between the floating gate 29 and the drain region 24 as $C_1$, and the capacitance (of the section of the silicon oxide layer 28) between the floating gate 29 and the programming region 26 as $C_2$, the potential of the floating gate FG is expressed as follows:

$$V_{FG}=V_{CG}\cdot C_2/(C_1+C_2) \tag{1}$$

As is apparent from the operation (1), the voltage $V_{FG}$ may be increased by decreasing the capacitance C1, i.e., the facing area of the floating gate 29 and the drain region 24. The voltage needed for erasing and programming can be reduced accordingly. In other words, the EEPROM can operate on a reduced power voltage.

However, decreasing the facing area between the floating gate 29 and the drain region 24 of the cell transistor results in decrease in size of the cell transistor, so that the on-state current of the cell transistor is reduced to lower the operation speed.

SUMMARY OF THE INVENTION

It is therefore an object of the present invention to provide an EEPROM having an improved memory cell structure.

It is another object of the present invention to provide an EEPROM including a plurality of memory cells, each of which has such a structure that enhances a voltage applied to a floating gate on erasing and programming without lowering an integration density as well as a cell transistor size.

It is still another object of the present invention to provide a non-volatile memory cell in which injection and extraction of carriers into and from a floating gate are performed in a manner other than a conventional manner.

A memory device according to the present invention includes a plurality of memory cell transistors, each of which has a drain region, a source region and a programming region selectively formed in a semiconductor substrate and a floating gate formed to cover a channel region between the source and drain regions, a part of the drain region and a part of the programming region with an intervening gate insulating film, wherein the part of the drain region is made larger in area than the part of the programming region. The capacitance between the floating gate and the programming region is thereby made smaller than the capacitance between the floating gate and the drain region.

With the cell structure thus constructed, the injection and extraction of carriers take place between the floating gate and the programming region, not between the floating region and the drain region. This is because the voltage applied between the programming region and the floating gate becomes considerably larger than that applied between the floating region and the drain region. The drain and source regions can be thus formed with a desired area to obtain a relatively large conductive current.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
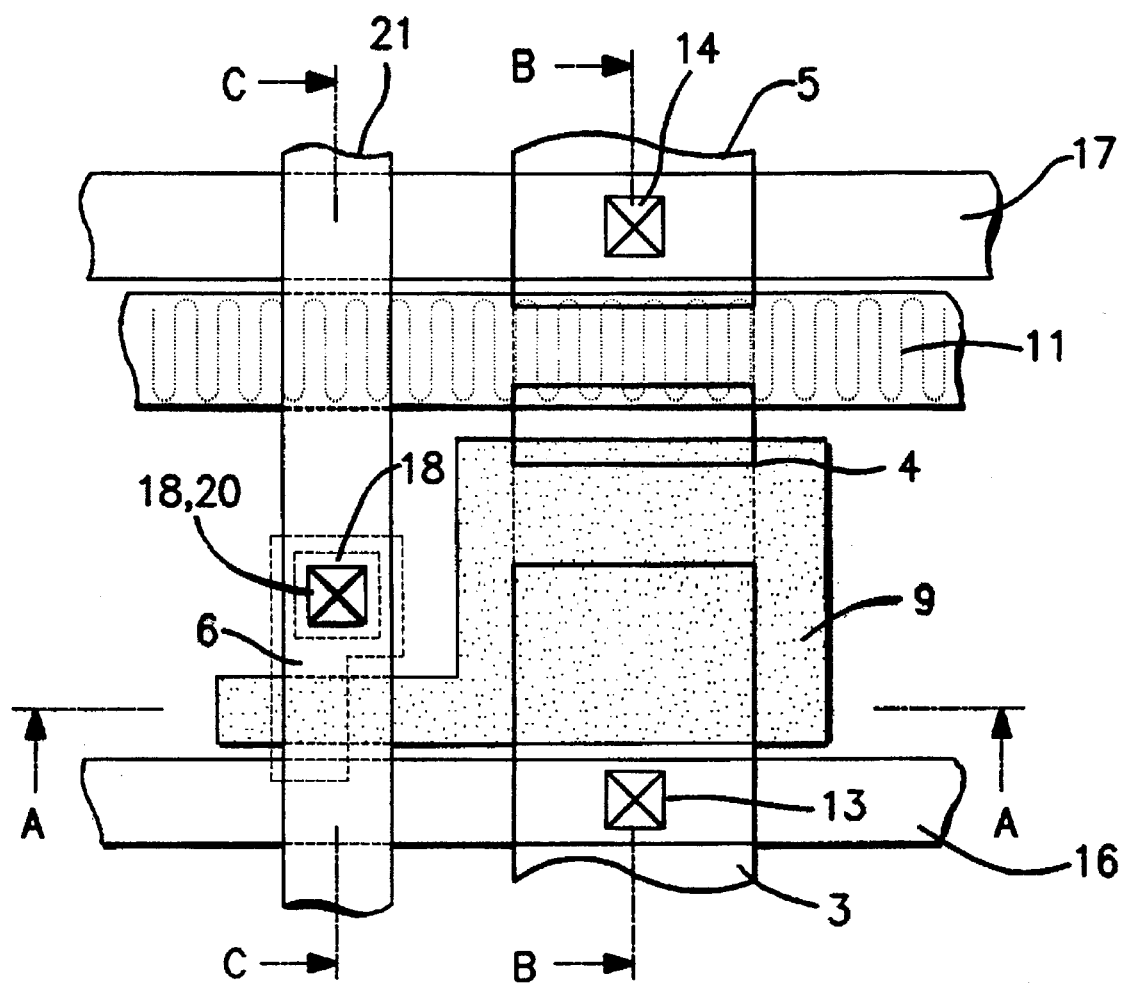
FIG. 1 is a plan view illustrative of one memory cell according to a first embodiment of the present invention.
Figure 2A:
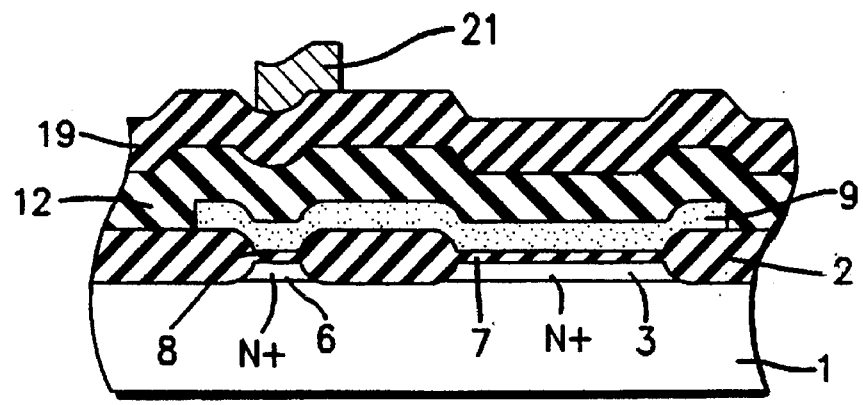
FIG. 2(A), FIG. 2(B) and FIG. 2(C) are cross sectional views taken along a line A—A, a line B—B and a line C—C shown in FIG. 1, respectively.

Referring now to FIG. 1 as well as FIGS. 2(A), (B) and (C), the description will be made on a memory cell according to the first embodiment of the present invention. This memory cell is formed on a monocrystalline silicon substrate as a semiconductor substrate. This substrate is of a P-type as one conductivity type. A plurality of device formation regions or active regions are provided and defined in the substrate 1 by a field oxide layer 2.

The memory cell illustrated therein is composed of a cell transistor and select transistor. The cell transistor has diffusion layers 3, 4 and 6 as a drain region, a source region and a programming region, respectively. The select transistor has diffusion regions 4 and 5 as a drain region and a source region, respectively. Each of the regions 3–4 is of an N-type as the other conductivity type.

As is apparent from the drawings, a gate insulating layer 7 made of silicon oxide is formed on a part of the drain region 3, a channel region between the drain region 3 and source region 4, and another gate insulating film 8 made of silicon oxide is formed on a part of the programming region 6. A floating gate 9 made of polysilicon is formed on the gate insulating film 7 and 8 in the shape shown in the drawings. Since the floating gate 9 overlaps with a major part of the drain region 3, each of the regions 3–6 is formed by ion implantation prior to the formation of the floating gate (FG), unlike the conventional method.

There is further provided a selector gate 11 made of polysilicon over a channel region between the source region 4 and bit line region 5 with an intervening gate oxide layer 10. The floating gate 9 and the selector gate 11 may be formed simultaneously as a first level of wiring layer.

An interlayer insulating layer 12 is formed over the entire surface, and contact holes 13, 14 and 15 are made therein. An aluminum common line 16 is formed to be connected to the region 3 through the contact hole 13, an aluminum bit line 17 is formed to be connected to the region 5 through the contact hole 14. A contact metal 18 made of aluminum is formed to fill the contact hole 15 to be connected to the programming region 6. These metal lines 16, 17 and 18 are formed as a first level metal wiring layer.

A second inter-layer insulating layer 19 is formed over the entire surface, through which a through-hole 20 is formed, and a wiring line 21 made of aluminum is formed to be connected to the contact metal 18 and thus to the programming region 6.

Figure 3:
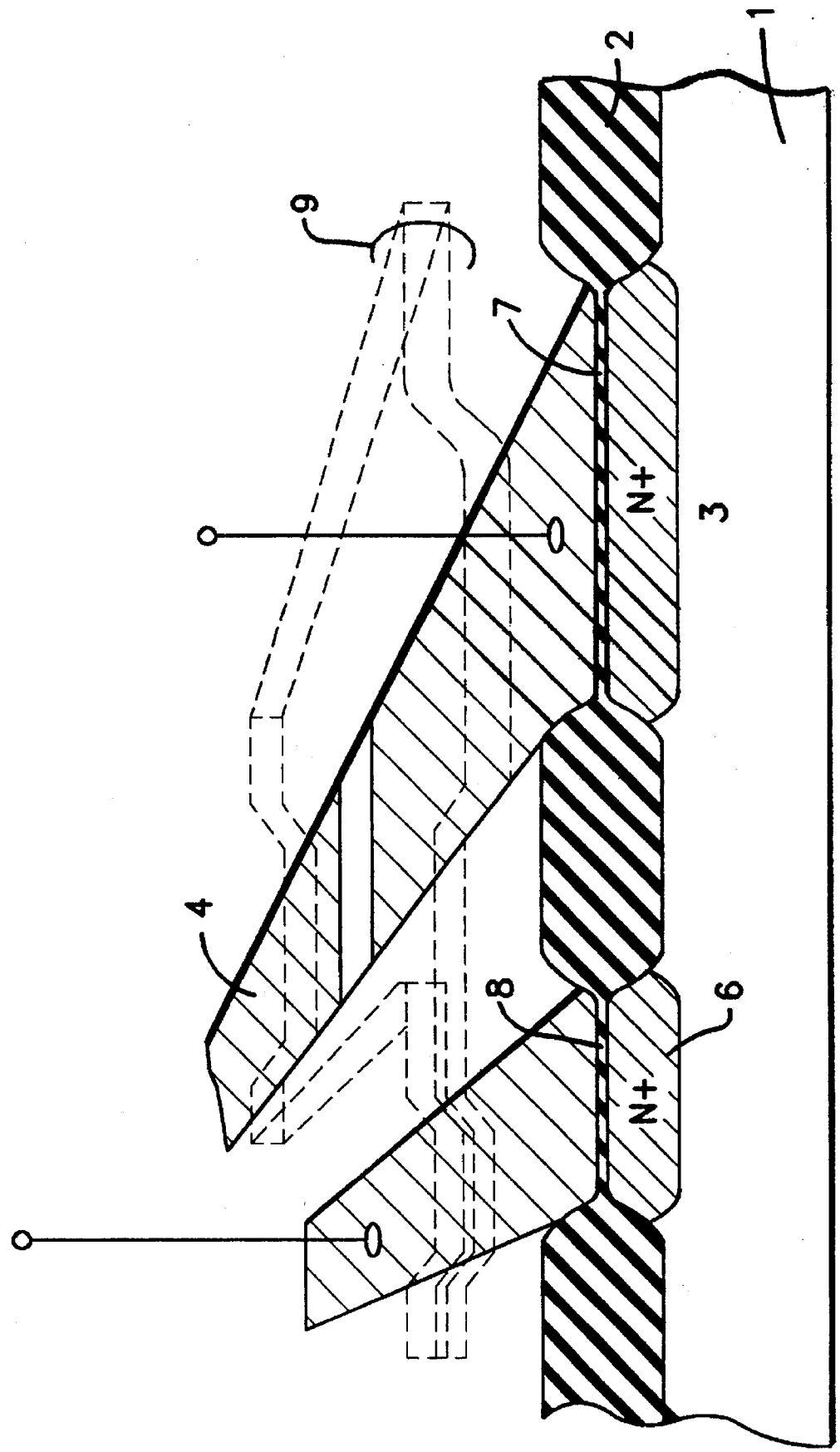
FIG. 3 is a perspective view of the floating gate shown in FIG. 1.

As is apparent from FIG. 1 and further from FIG. 3, the facing area between the floating gate 9 and the part of the drain region 3 is made larger than the facing area between the floating gate 9 and the programming region 6. Accordingly, representing the voltage applied across the drain region 3 as $V_D$, the capacitance between the floating gate 9 and the part of drain region 3 as $C_1$, and the capacitance between the floating gate 9 and programming region 6 as $C_2$, the potential of the floating gate FG is expressed as follows:

$$V_{FG} = V_D \cdot C_1/(C_1+C_2) \quad (2)$$

Here, if the silicon oxide layers 7 and 8 have an identical thickness, then $$V_{FG} = V_D \cdot S_1/(S_1+S_2) \quad (3)$$

wherein $S_1$ is the overlapping area between the floating gate 9 and the drain region 3, and $S_2$ is the overlapping area between the floating gate and the programming region 6. Since the area $S_2$ is made considerably small as compared with the area $S_1$, the F-N tunnel phenomenon takes place mainly at the silicon oxide layer 8 covering the programming region 6. That is, the injection and extraction of carriers into and from the floating gate 9 occur at the programming region 6 in place of the drain region 3.

In the present embodiment, the capacitance ratio of $C_1:C_2$ is designed to be 10:1, so that 90% of the applied voltage may be effectively utilized as the floating gate voltage $V_{FG}$. Taking into account the fluctuations depending on the respective processes, however, it is preferrable to set the radio of $C_1:C_2$ to be 20:1 or more.

As mentioned above, according to the present invention, electrons are designed to be injected and extracted (or ejected) between the floating gate 9 and the programmable region 6.

Figure 4:
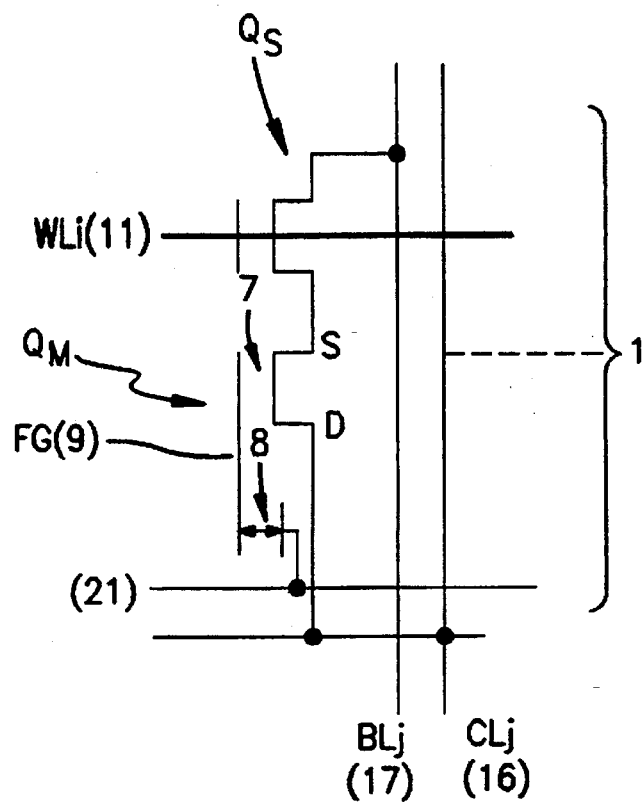
FIG. 4 is an equivalent circuit schematic of the cell shown in FIG. 1 and FIG. 2.

Referring to FIG. 4, the memory cell thus constructed is composed of the memory transistor Qm and the select transistor Qs which are connected to programming line 21, the common line ($CL_j$) 16, the bit line ($BL_j$) 17 and the word line ($WL_i$) 11.

An erasing operation for each cell Cij is performed by setting the controllable region 6 to 0 volts, the drain region 3 to a high potential and the source region 4 open. The electrons are thus injected into the floating gate 9 via the silicon oxide layer 8 by the F-N tunnel effect from the programming region 6.

A programming operation for each cell Cij is performed by setting each of the drain region 3 and source region 4 to 0 volt and the programming region 6 to the high potential. The electrons are thereby extracted or released from the floating gate 9 by the F-N tunnel effect to the programming region 6. The erased state is an enhancement state and the written state is a depletion state, and thus the binary determination is performed depending on whether electrons are included or not. The memory may be used in the opposite state depending on its manner of use. It is therefore in a reading operation the line 22 (the programming region 6) is supplied with a reading voltage of 0 volt while turning the select transistor Qs conductive by selecting the word line 11. If desired, the reading voltage may be negative or positive.

On the other hand, in cases where a particular cell Cij is not selected, all that is needed is to set the potential of the programmable region 6 or drain region 3 (common bit line $CL_j$) to about half the level when selected. With this reduction, the non-selected cell fails to undergo a sufficient potential difference to generate an F-N tunnel current, and thus neither writing nor erasing is accomplished.

Reading operation is performed by setting the word line (selector gate) $WL_i$ to a high level of potential to read out data in the bit line $BL_j$. This setting allows exclusion of influence of a large junction capacitance of the drain region 3 with a great area. More specifically, in cases where a large junction capacitance is present at the reading end, the capacitance functions as the capacitance at the drain end of the transistor to lower the charging and discharging efficiency of the transistor, and consequently the reading speed is slowed.

Figure 12:
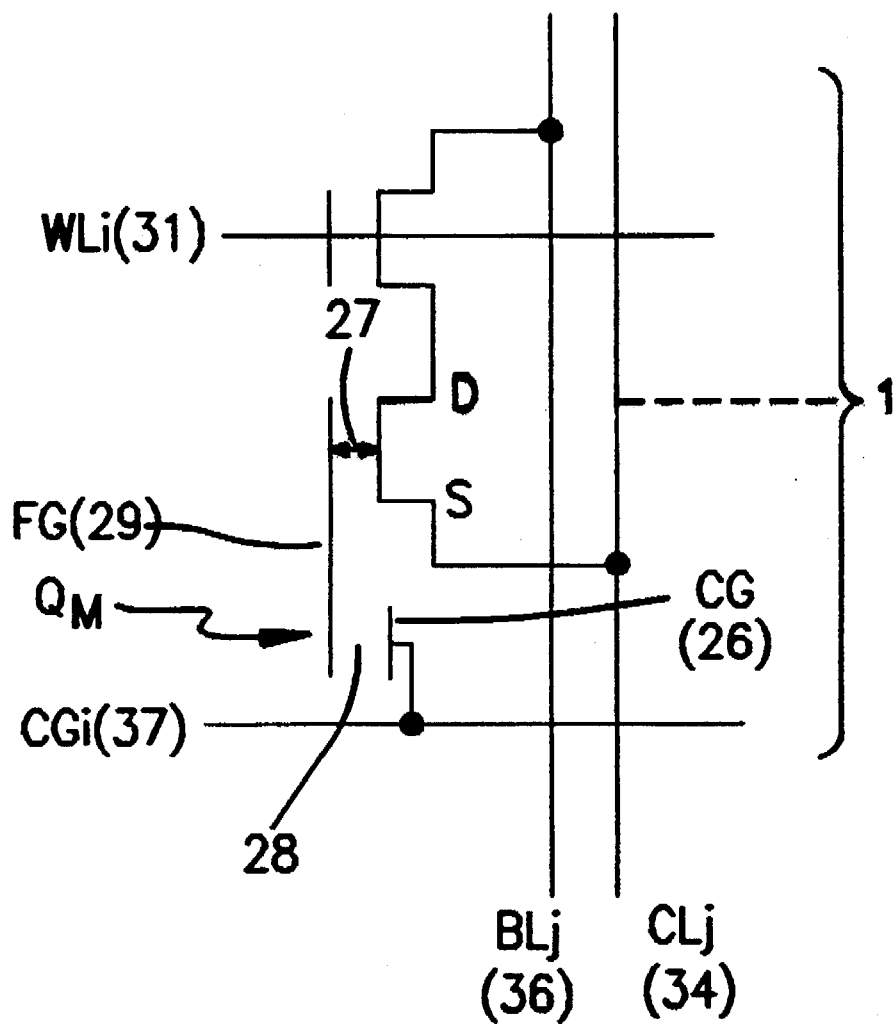
FIG. 12 is an equivalent circuit schematic of the cell shown in FIG. 11.

In addition, as show in FIG. 12, since a plurality of cells are connected to a single polysilicon-made control gate line 37 according to the prior art in order to prevent delays in application of a voltage to the control gate region 26, the effect of preventing delays in application of a voltage is accomplished on a plurality of cells as a group, and thus the prior art fails to overcome delays in application of a voltage which is caused by the control gate region 26 itself.

In contrast, however, according to the first embodiment of the present invention, the programming region 6 is independent and isolated per cell, and each programming region is individually connected to a metal layer 18 and a wiring line 21. As a result, the programming region 6 itself does not cause delays in application of a voltage.

Here, the programming region 6 may be extended in the same manner as the aluminum-made control gate line shown in FIG. 1. The region is not shown in such an extended manner in the present embodiment only for space considerations.

Figure 5:
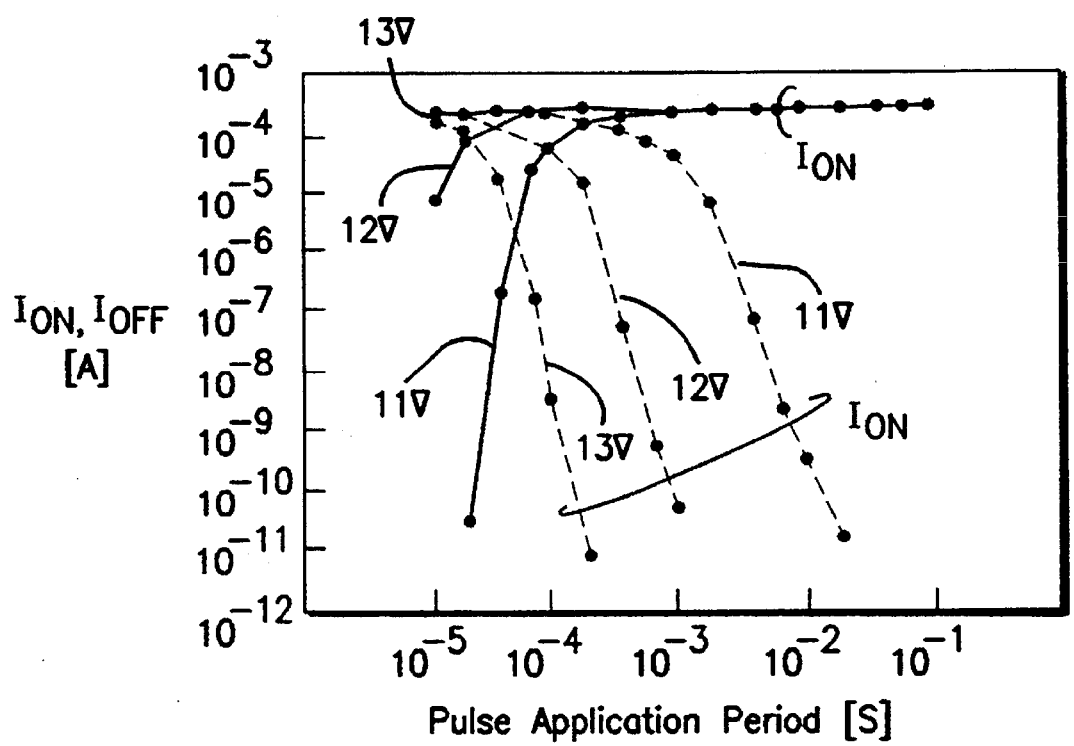
FIG. 5 is a graph illustrating a conductive current to a pulse applying period in the cell shown in FIG. 1.

FIG. 5 shows an instance of writing or erasure operation for the aforementioned cell construction. In cases where the silicon oxide films 7 and 8 are approximately 9.0 nm thick, application of a pulse of 12 volts for 1 ms produces 100 μA or more of writing-on resistor current $I_{ON}$ and 0.1 μA or less of erasure-off current $I_{OFF}$, and operation may be performed at 12 volts. This proves that the present invention allows lowering in the voltage, that is, improvement in the efficiency of the F-N tunnel effect as compared with the prior art which requires as a high potential as approximately 20 volts.

Figure 2B:
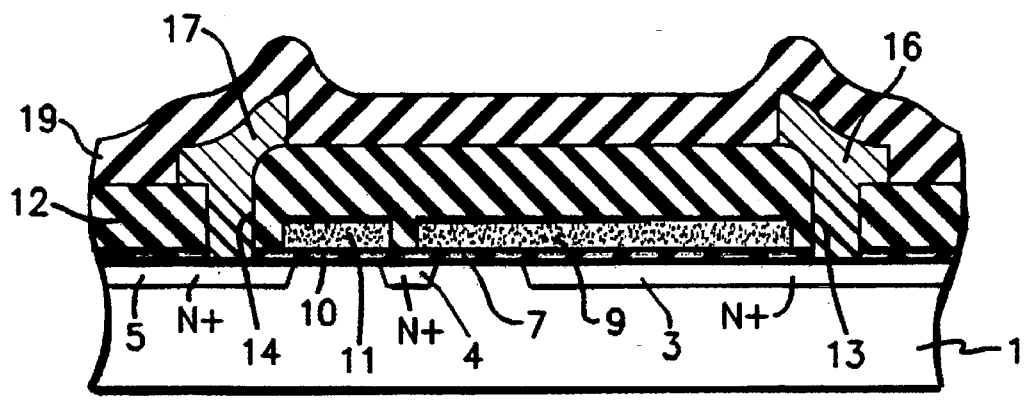
Figure 2C:
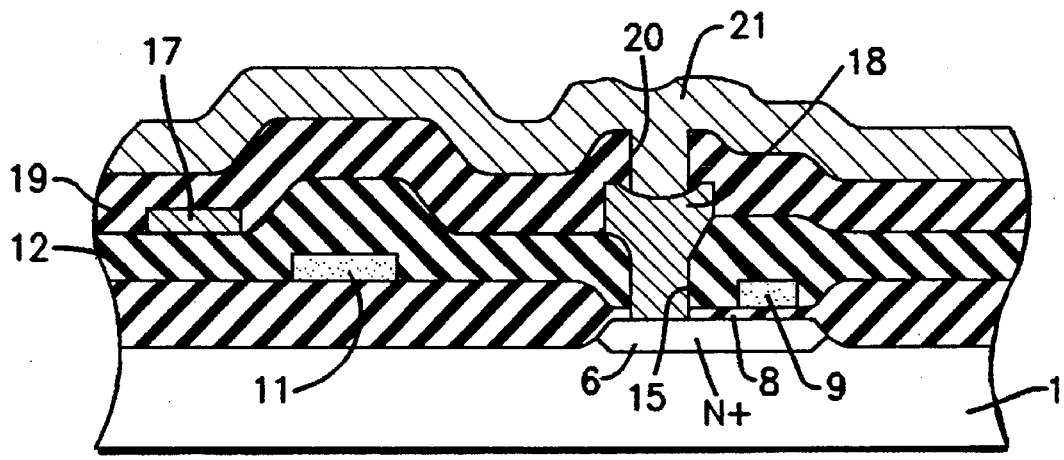
Figure 6:
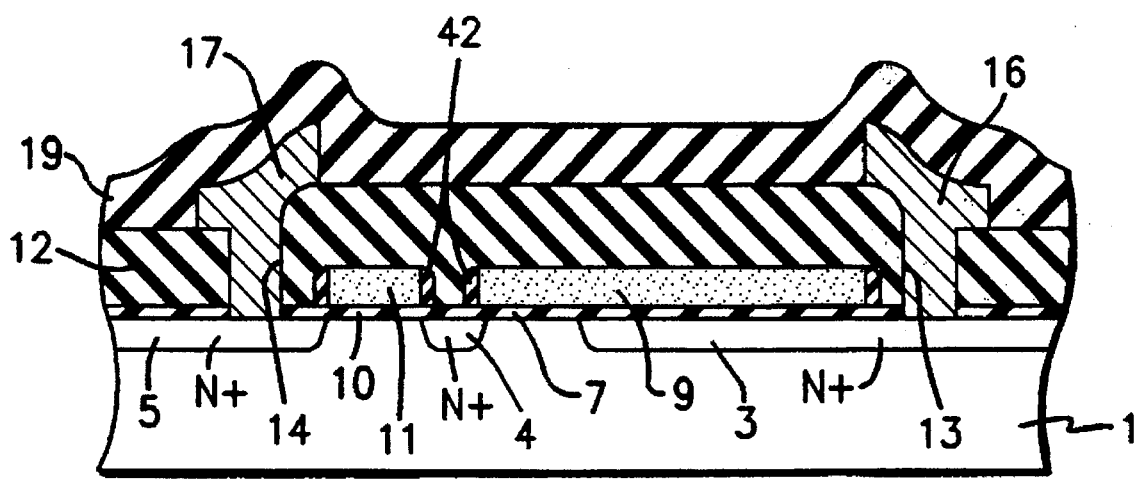
FIG. 6 is a cross sectional view illustrative of a part of a cell according to a second embodiment of the present invention.

FIG. 6 is a cross sectional view which shows a second embodiment of the non-volatile IC memory according to the present invention, which drawing is a counterpart of FIG. 2(B). Concretely, oxidation-resistant insulator layers (sidewall layers) 42 are formed on the respective sidewalls of the floating gate 9 and selector gate 11 to protect the floating gate 9. More specifically, this protection serves to prevent acceleration of oxidation of the silicon oxide layer 7 beneath the floating gate 9 in the later steps and to prevent oxidation of the floating gate 9 and silicon substrate 1. As a result, the writing and erasure operation properties are kept from being impaired. Here, the oxidation-resistant insulator layers 42 may be formed by etching back after the floating gate 9 and selector gate 11 have been oxidized.

Figure 7:
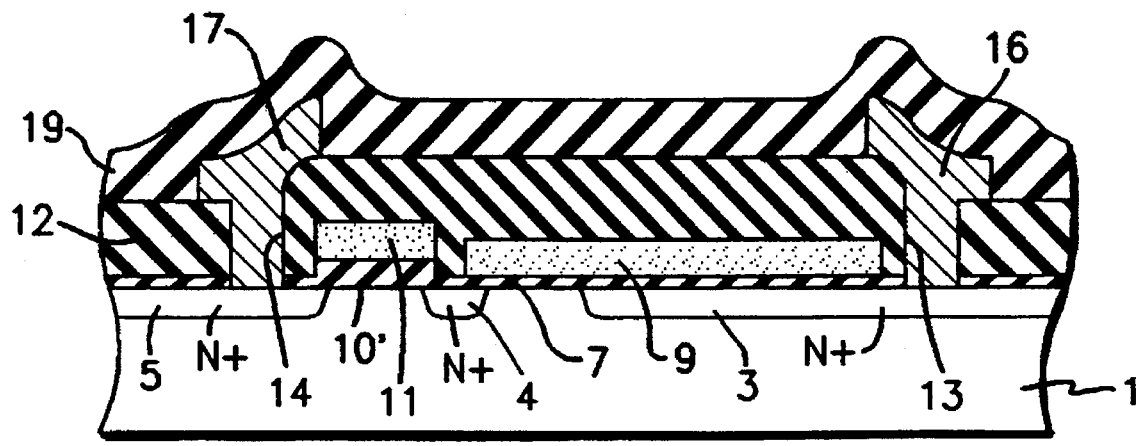
FIG. 7 is a cross sectional view illustrative of a part of a cell according to a third embodiment of the present invention.

FIG. 7 is a cross sectional view which shows a third embodiment of the non-volatile IC memory according to the present invention, which drawing is a counterpart of FIG. 2(B). Concretely, instead of the layer 10, a thicker gate oxide layer 10' is provided beneath the selector gate 11 to improve the resistance of the selector transistor to the insulator layer and thus to increase its reliability.

Figure 8:
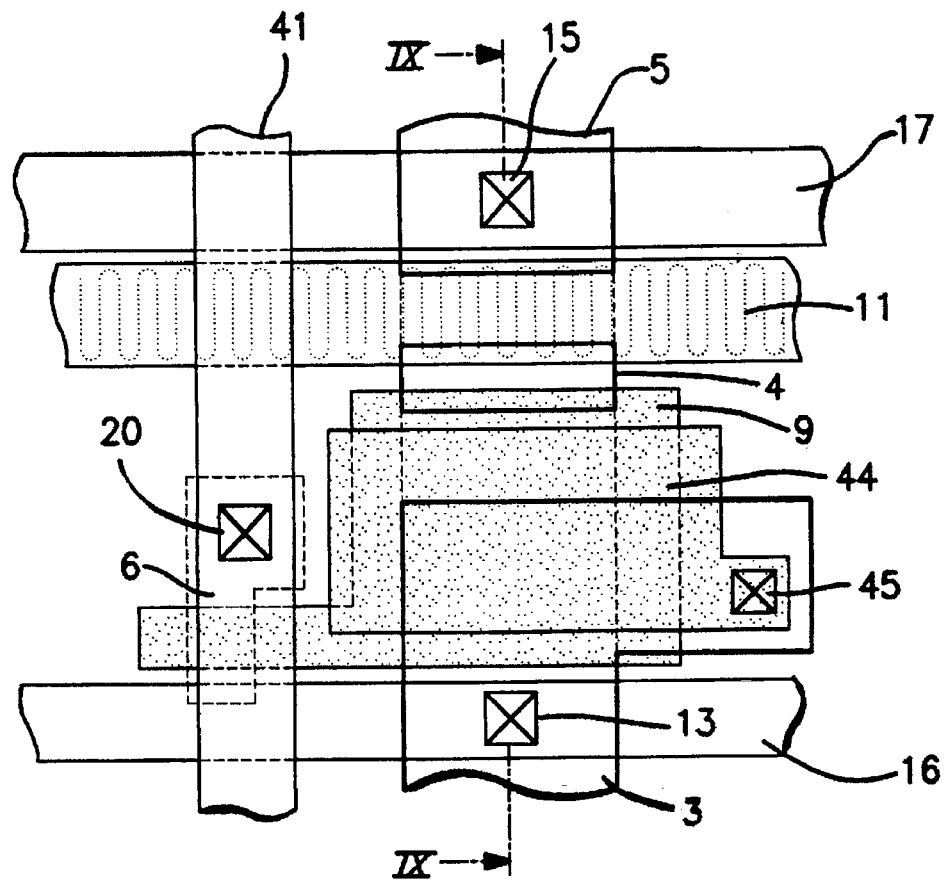
FIG. 8 is a cross sectional view illustrative of a part of a cell according to a fourth embodiment of the present invention.
Figure 9:
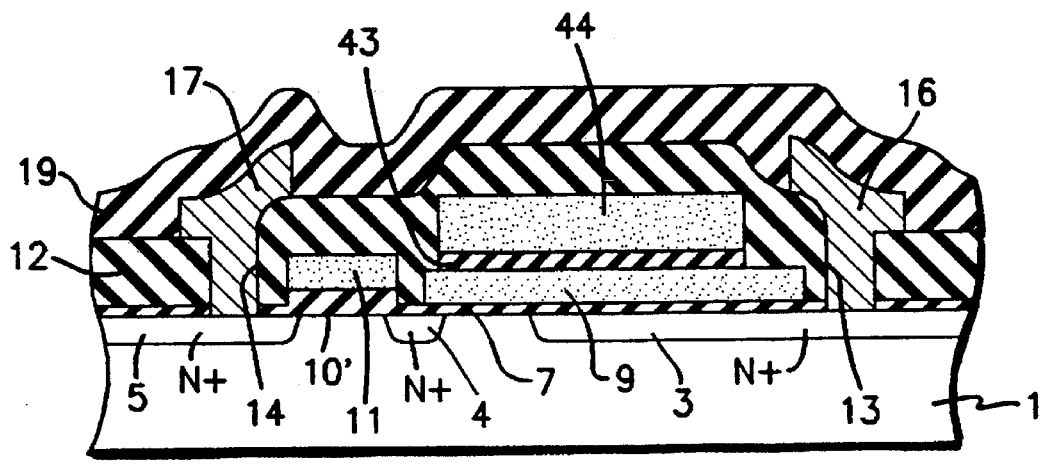
FIG. 9 is a cross sectional view taken along line IX—IX shown in FIG. 8.
Figure 10A:
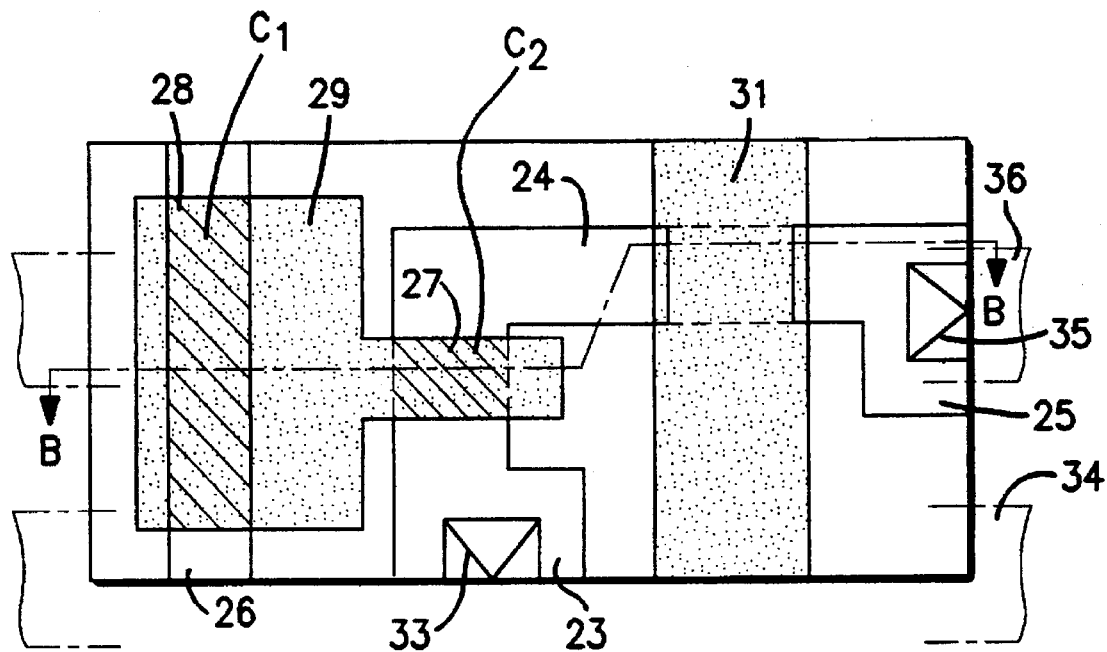
FIGS. 10(A) and 10(B) are a plan view and a cross sectional view illustrative of a prior art.
Figure 10B:
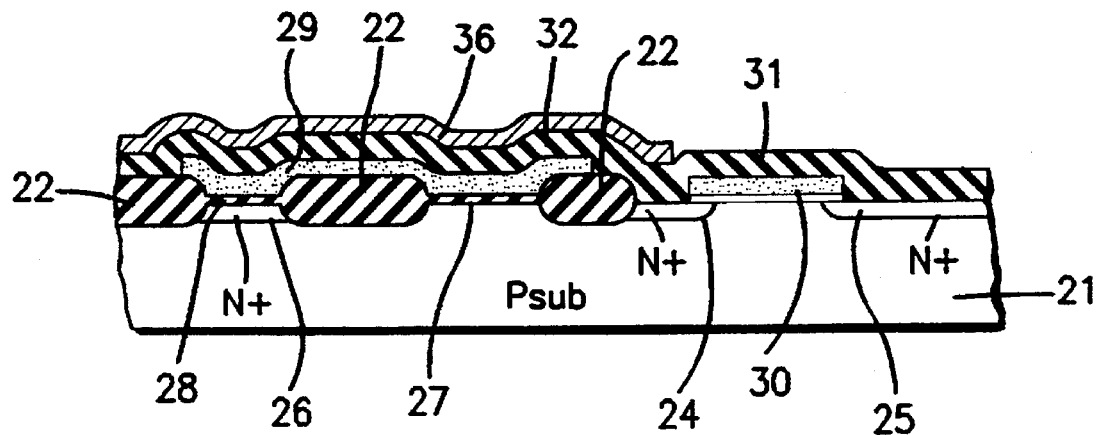
Figure 11:
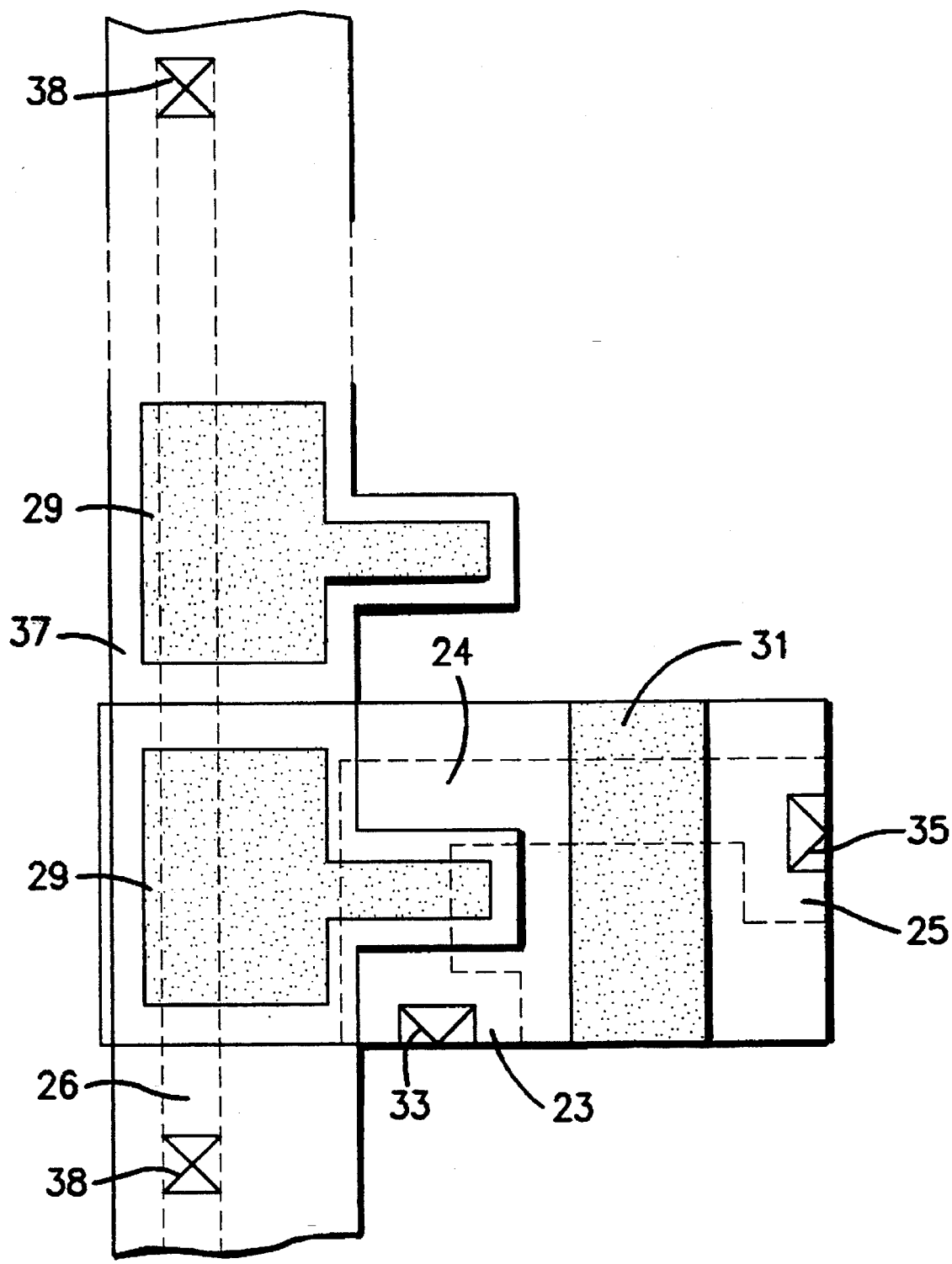
FIG. 11 is a plan view illustrative of two cells shown in FIG. 10.

FIG. 8 is a plan view which shows a fourth embodiment of the non-volatile IC memory according to the present invention, and FIG. 9 is a cross sectional view taken on line IX—IX in FIG. 8. Referring to FIG. 8 and FIG. 9, a polysilicon protecting gate 44 is further provided on the floating gate 9 with an intervening insulating layer (e.g., silicon oxide layer) 43. The drain region 3 in this embodiment is formed to have a projecting portion to which the protecting gate 44 is connected to through a contact hole 45. Since the additional gate 44 is provided, there exists the parallel connection of the capacitance $C_3$ between the floating gate 9 and protecting gate 44 and the capacitance $C_1$ between the floating gate 9 and drain region 3, so that the following equation is derived:

$$V_{FG}=V_D (C_1+C_3)/(C_1+C_2+C_3) \qquad (4)$$

The $V_{FG}$ is thus increased. In other words, the same value of $V_{FG}$ may be obtained with a smaller capacitance $C_1$, that is, with a smaller area of the facing sections of the floating gate 9 and drain region 3, which contributes to a high degree of integration. As an example, assuming that the thickness of the silicon oxide layer 7 is 90 Å, the thickness of the insulator layer 43 is 180 Å, the area of the facing sections of the floating gate 9 and protecting gate 44 is $\Delta S$, the same value of $V_{FG}$ may be obtained with a reduction $\Delta S'$ of the area of the facing sections of the floating gate 9 and drain region 3, which may be calculated as follows:

$$\epsilon S_1/90 \text{ Å}=\epsilon(S_1-\Delta S')/90 \text{ Å}+\epsilon \Delta S/180 \text{ Å} \therefore \Delta S'=\Delta S/2$$

wherein $\epsilon$ is the dielectric constant of the oxide layer. A high degree of integration may be accomplished in this way.

As explained above, according to the present invention, since no F-N tunnel effect is produced between the floating gate and drain region, electrons are not trapped in the insulator layer for the cell transistor, and thus the properties of the cell transistor are kept from being impaired. In addition, the voltage $V_{FG}$ across the floating gate may be increased to enhance the F-N tunnel effect.

Further, since a separate programmable region is provided for each cell, delays in application of a voltage may be prevented. Furthermore, reading operation may be accelerated since the reading operation is performed from the source drain end with a small junction capacitance.

Moreover, since the programmable region is not designed to function as a transistor, the area of the facing sections of the floating gate and programmable region may be minimized to limits, and the area of the facing sections of the floating gate and drain region may be determined correspondingly, and thus the voltage $V_{FG}$ across the floating gate may be increased accordingly to enhance the F-N tunnel effect.

In addition, since the programmable region is provided independently for each cell, delays in feeding a voltage are negligible.

It is apparent that the present invention is not limited to the above embodiments but may be modified and changed without departing from the scope and spirit of the invention.

What is claimed is:

1. A semiconductor memory device having at least one memory cell and a select transistor, said memory cell comprising a source region, a drain region, a floating gate formed on a gate insulating film covering a channel region between said source and drain regions, a programming region formed separately from said source and drain regions to inject carriers into said floating gate; said select transistor being connected to said source of said memory cell and having a selector gate constituted by a first wiring line and conducting a voltage level of said source of said memory cell to a second wiring by causing said selector gate to activate; said drain region of said memory cell being connected to a third wiring line through a first contact hole, and said programming region of said memory cell being connected to a fourth wiring line through a second contact hole, and said first wiring line being parallel to said third wiring line and said second wiring line being perpendicular to said fourth wiring line.

2. A semiconductor memory device comprising a semiconductor substrate and a plurality of memory cells, each of said memory cells including a first region, a second region and a programming region selectively formed in said semiconductor substrate, a first gate insulating film covering a part of said first region, a second gate insulating film covering a part of said programming region, and a floating gate having a first portion overlapping said part of said first region to form a first capacitance therebetween and a second portion overlapping said part of said programming region to form a second capacitance, said first capacitance being larger than said second capacitance, a third region selectively formed in said semiconductor substrate apart from said second region, a third gate insulating film covering a portion of said semiconductor substrate between said second and third regions, and a selector gate provided on said third insulating film, said third gate insulating film having a thickness greater than a thickness of each of said first and second gate insulating films.

3. A semiconductor memory device comprising a semiconductor substrate and a plurality of memory cells, each of said memory cells including a first region, a second region and a programming region selectively formed in said semiconductor substrate, a first gate insulating film covering a part of said first region, a second gate insulating film covering a part of said programming region, said first gate insulating film and said second gate insulating film being of substantially equal thickness, a floating gate having a first portion overlapping said part of said first region to form a first capacitance therebetween and a second portion overlapping said part of said programming region to form a second capacitance, an area of said first portion being larger than an area of said second portion, such that said first capacitance is larger than said second capacitance, said device further comprising a third region selectively formed in said semiconductor substrate apart from said second region, a third gate insulating film covering a portion of said semiconductor substrate between said second and third regions, and a selector gate provided on said third insulating film, said third gate insulating film having a thickness greater than a thickness of each of said first and second gate insulating films.

* * * * *